(12) United States Patent
Hirose

(10) Patent No.: US 12,482,708 B2
(45) Date of Patent: Nov. 25, 2025

(54) WAFER PROCESSING METHOD

(71) Applicant: DISCO CORPORATION, Tokyo (JP)

(72) Inventor: Tsubasa Hirose, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 426 days.

(21) Appl. No.: 18/049,798

(22) Filed: Oct. 26, 2022

(65) Prior Publication Data

US 2023/0141560 A1    May 11, 2023

(30) Foreign Application Priority Data

Nov. 5, 2021 (JP) .................................. 2021-181181

(51) Int. Cl.
*H01L 21/78* (2006.01)
(52) U.S. Cl.
CPC .................................... *H01L 21/78* (2013.01)
(58) Field of Classification Search
CPC ....................................................... H01L 21/78
See application file for complete search history.

(56) References Cited

U.S. PATENT DOCUMENTS

| | | |
|---|---|---|
| 2013/0026153 A1 | 1/2013 | Ide et al. |
| 2017/0098733 A1 | 4/2017 | Tamemoto et al. |
| 2018/0247871 A1 | 8/2018 | Inoue et al. |
| 2019/0217419 A1* | 7/2019 | Kirihara ............... B23K 26/364 |
| 2021/0139321 A1* | 5/2021 | Patil .................... B23K 26/0006 |

FOREIGN PATENT DOCUMENTS

| | | |
|---|---|---|
| DE | 102017212858 A1 | 1/2019 |
| JP | 2002192370 A | 7/2002 |
| JP | 2004188475 A | 7/2004 |
| JP | 2013046924 A | 3/2013 |
| JP | 2014221483 A | 11/2014 |
| JP | 2015085347 A | 5/2015 |
| JP | 2016042516 A | 3/2016 |
| JP | 2017069510 A | 4/2017 |
| JP | 2017073443 A * | 4/2017 |
| JP | 2018142702 A | 9/2018 |

OTHER PUBLICATIONS

Office Action issued in counterpart German patent application No. 10 2022 211 455.8, dated Oct. 7, 2024.
Office Action dated issued in counterpart Japanese patent application No. 2021-181181, dated May 20, 2025.
Office Action issued in counterpart Japanese patent application No. 2021-181181, dated Oct. 7, 2025.

* cited by examiner

*Primary Examiner* — Mohammad M Choudhry
(74) *Attorney, Agent, or Firm* — Greer Burns & Crain Ltd.

(57) ABSTRACT

A wafer processing method includes a shield tunnel forming step of executing irradiation with a laser beam with a wavelength having transmissibility with respect to a wafer to form shield tunnels each including a fine pore and a modified tube that surrounds the fine pore, and a dividing step of applying an external force to the wafer to divide the wafer into individual device chips. The shield tunnel forming step includes a first shield tunnel forming step of successively forming the shield tunnels in one planned dividing line with interposition of at least intervals corresponding to one shield tunnel, and a second shield tunnel forming step of successively forming the shield tunnels in regions in which the intervals are provided in the planned dividing line.

8 Claims, 3 Drawing Sheets

WAFER PROCESSING METHOD

BACKGROUND OF THE INVENTION

Field of the Invention

The present invention relates to a wafer processing method by which a wafer is divided into individual device chips.

Description of the Related Art

A wafer in which a plurality of devices such as integrated circuits (ICs) and large-scale integration (LSI) circuits are formed on a front surface in such a manner as to be marked out by a plurality of planned dividing lines that intersect is divided into individual device chips by a dicing apparatus or a laser processing apparatus, and the device chips obtained by the dividing are used for electrical equipment such as mobile phones and personal computers.

A laser processing apparatus substantially includes a chuck table that holds a wafer, an imaging unit that images the wafer held by the chuck table and detects a region to be processed, a laser beam irradiation unit that irradiates the wafer held by the chuck table with a laser beam, and a processing feed mechanism that executes processing feed of the chuck table and the laser beam irradiation unit relative to each other, and can process the wafer with high accuracy (for example, refer to Japanese Patent Laid-open No. 2015-085347).

There are the following types as types of the laser beam irradiation unit: a type that executes irradiation with a laser beam with a wavelength having absorbability with respect to a wafer to execute ablation processing (for example, refer to Japanese Patent Laid-open No. 2004-188475); a type that executes irradiation with a laser beam with a wavelength having transmissibility with respect to a wafer to execute internal processing by which a modified layer is formed inside the wafer (for example, refer to Japanese Patent No. 3408805); and a type that executes irradiation with a laser beam with a wavelength having transmissibility with respect to a wafer in such a manner that a value obtained by dividing a numerical aperture (NA) of a light collector by a refractive index (N) of the wafer is in a range from 0.05 to 0.2, to form a shield tunnel including a fine pore and a modified tube that surrounds the fine pore inside the wafer (for example, refer to Japanese Patent Laid-open No. 2014-221483).

SUMMARY OF THE INVENTION

Incidentally, when a wafer is divided into individual device chips through irradiation with a laser beam along planned dividing lines by the above-described laser processing apparatus, there is a problem that, due to a crystal structure of a material that configures the wafer, a crack develops to a region outside a planned dividing line through the irradiation with the laser beam, which gives damage to a device.

Thus, an object of the present invention is to provide a wafer processing method that can solve the problem that a crack develops to a region outside a planned dividing line and gives damage to a device when a wafer is processed through irradiation with a laser beam.

In accordance with an aspect of the present invention, there is provided a wafer processing method by which a wafer in which a plurality of devices are formed on a front surface in such a manner as to be marked out by a plurality of planned dividing lines that intersect is divided into individual device chips, the wafer processing method including a shield tunnel forming step of executing irradiation with a laser beam with a wavelength having transmissibility with respect to the wafer to form shield tunnels each including a fine pore and a modified tube that surrounds the fine pore, and a dividing step of applying an external force to the wafer to divide the wafer into the individual device chips after executing the shield tunnel forming step. The shield tunnel forming step includes a first shield tunnel forming step of successively forming the shield tunnels in one planned dividing line with interposition of at least intervals corresponding to one shield tunnel, and a second shield tunnel forming step of successively forming the shield tunnels in regions in which the intervals are provided in the planned dividing line.

Preferably, the shield tunnels formed in the first shield tunnel forming step and the shield tunnels formed in the second shield tunnel forming step are formed in such a manner that steps are alternately made in a thickness direction. Preferably, the shield tunnels are stacked in the thickness direction of the wafer in the shield tunnel forming step. Preferably, the shield tunnel forming step includes, when the shield tunnels are stacked, a third shield tunnel forming step of forming shield tunnels above the shield tunnels formed in the first shield tunnel forming step, and a fourth shield tunnel forming step of forming shield tunnels above the shield tunnels formed in the second shield tunnel forming step.

Preferably, in the shield tunnel forming step, when the shield tunnels are stacked in the thickness direction of the wafer, the shield tunnels on an upper side are stacked in such a manner as not to be in contact with the shield tunnels on a lower side. Preferably, the wavelength of the laser beam is 532 nm, power per pulse is 2.0 to $4.0 \cdot 10^{-3}$ J, and an interval of a spot is 10 to 15 μm.

According to the present invention, development of a crack to a region outside the planned dividing line can be suppressed. Moreover, an influence of a hot spot that would be generated when irradiation with the laser beam is executed to successively form shield tunnels adjacent to each other is avoided, and the problem that a crack develops to a region in which a device is formed and the device is damaged can be eliminated.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A wafer processing method according to embodiments of the present invention will be described in detail below with reference to the accompanying drawings.

In the following, a laser processing apparatus suitable to execute the processing method of an embodiment of the present invention will be described with reference to the accompanying drawings, and the wafer processing method according to the present embodiment will be described.

Figure 1:
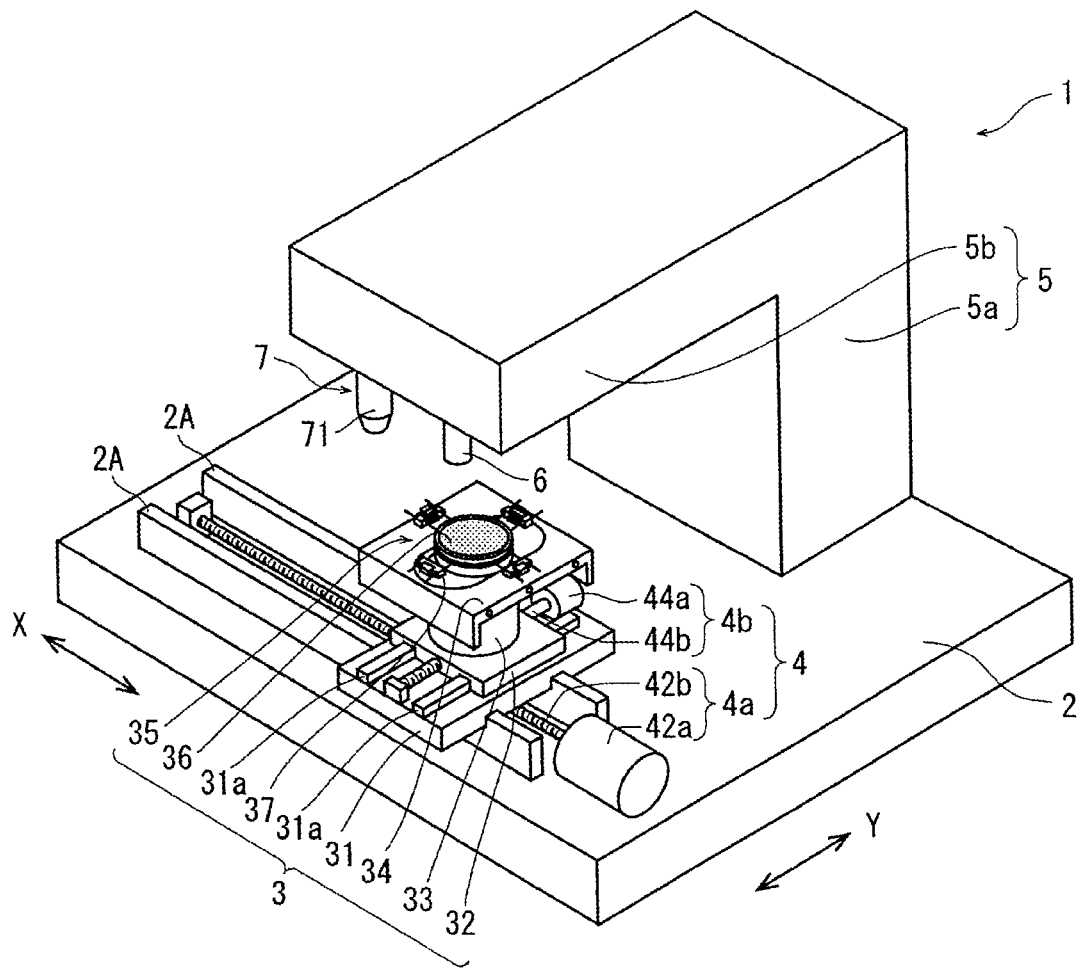
FIG. 1 is an overall perspective view of a laser processing apparatus suitable to execute a wafer processing method according to the present invention.

In FIG. 1, an overall perspective view of a laser processing apparatus 1 is illustrated. The laser processing apparatus 1 includes a holding unit 3 that is disposed over a base 2 and holds a wafer 10 (see FIG. 2) to be described later, a movement mechanism 4 that moves the holding unit 3 in an X-axis direction and a Y-axis direction, and an imaging unit 6 that images the wafer 10 held by the holding unit 3. The laser processing apparatus 1 further includes a laser beam irradiation unit 7 that irradiates the wafer 10 held by the holding unit 3 with a laser beam to execute desired processing, and a frame body 5 having a vertical wall part 5a disposed upright on a lateral side of the movement mechanism 4 and a horizontal wall part 5b extending from an upper end part of the vertical wall part 5a in a horizontal direction. Although diagrammatic representation is omitted, optical systems that configure the imaging unit 6 and the laser beam irradiation unit 7 are housed and held inside the horizontal wall part 5b.

As illustrated in FIG. 1, the holding unit 3 includes a rectangular X-axis direction movable plate 31 mounted over the base 2 movably in the X-axis direction, a rectangular Y-axis direction movable plate 32 mounted over the X-axis direction movable plate 31 movably in the Y-axis direction, a circular cylindrical support column 33 fixed to an upper surface of the Y-axis direction movable plate 32, and a rectangular cover plate 34 fixed to an upper end of the support column 33. A chuck table 35 that passes through a long hole formed in the cover plate 34 and extends upward is disposed over the cover plate 34. The chuck table 35 is means that holds the wafer 10 by using an XY plane defined based on X coordinates and Y coordinates as a holding surface, and can be rotated by rotational drive means that is housed in the support column 33 and is not illustrated. At an upper surface of the chuck table 35, a suction adhesion chuck 36 that configures the holding surface formed of a porous material having gas permeability is disposed. The suction adhesion chuck 36 is connected to suction means, not illustrated, by a flow path passing through the support column 33. Around the suction adhesion chuck 36, four clamps 37 used when the wafer 10 to be described later is held on the chuck table 35 are disposed at equal intervals.

The movement mechanism 4 includes an X-axis movement mechanism 4a that moves the above-described chuck table 35 in the X-axis direction and a Y-axis movement mechanism 4b that moves the chuck table 35 in the Y-axis direction. The X-axis movement mechanism 4a converts rotational motion of a motor 42a into linear motion through a ball screw 42b and transmits the linear motion to the X-axis direction movable plate 31 to move the X-axis direction movable plate 31 in the X-axis direction along a pair of guide rails 2A disposed along the X-axis direction on the base 2. The Y-axis movement mechanism 4b converts rotational motion of a motor 44a into linear motion through a ball screw 44b and transmits the linear motion to the Y-axis direction movable plate 32 to move the Y-axis direction movable plate 32 in the Y-axis direction along a pair of guide rails 31a disposed along the Y-axis direction on the X-axis direction movable plate 31.

The above-described laser processing apparatus 1 is controlled by a controller not illustrated. The controller is configured by a computer and includes a central processing unit (CPU) that executes calculation processing in accordance with a control program, a read only memory (ROM) that stores the control program and so forth, a readable-writable random access memory (RAM) for temporarily storing a detection value obtained by detection, a calculation result, and so forth, an input interface, and an output interface (diagrammatic representation of details is omitted). The imaging unit 6, the laser beam irradiation unit 7, the X-axis movement mechanism 4a and the Y-axis movement mechanism 4b that configure the movement mechanism 4, and so forth are connected to the controller to be controlled.

Figure 2:
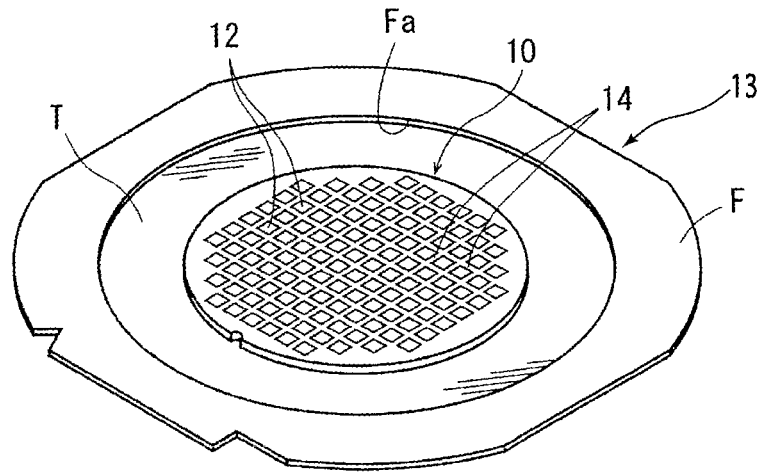
FIG. 2 is a perspective view of a wafer unit.

By the wafer processing method based on the present invention, for example, the wafer 10 illustrated in FIG. 2 is processed. The wafer 10 is a wafer made of SiC with a thickness of approximately 100 μm, for example, and a plurality of devices 12 are formed on a front surface 10a of the wafer 10 in such a manner as to be marked out by a plurality of planned dividing lines 14 that intersect. When being processed by the above-described laser processing apparatus 1, as illustrated in the diagram, the wafer 10 is supported through an adhesive tape T by an annular frame F having an opening part Fa that can house the wafer 10, and is loaded into the laser processing apparatus 1 as a wafer unit 13. The wafer 10 is divided into individual device chips by execution of the wafer processing method according to the present embodiment to be described below.

In the wafer processing method according to the present embodiment, first, a shield tunnel forming step of executing irradiation with a laser beam with a wavelength having transmissibility with respect to the wafer 10 to form shield tunnels each including a fine pore and a modified tube that surrounds the fine pore is executed. A procedure of executing the shield tunnel forming step of the present embodiment will be more specifically described below.

In execution of the shield tunnel forming step, after the above-described wafer 10 is prepared, the wafer 10 is placed on the suction adhesion chuck 36 of the chuck table 35 of the laser processing apparatus 1 illustrated in FIG. 1 and is held under suction, and the frame F is clamped and fixed by the clamps 37. Subsequently, the above-described movement mechanism 4 is actuated, and the wafer 10 is positioned directly under the imaging unit 6 and is imaged. Position information regarding the devices 12 and the planned dividing lines 14 of the wafer 10 is detected and is stored in the above-described controller. Moreover, based on the position information, the movement mechanism 4 and so forth are actuated, and a predetermined one of the planned dividing lines 14 of the wafer 10 is aligned with the X-axis direction.

Figure 3A:
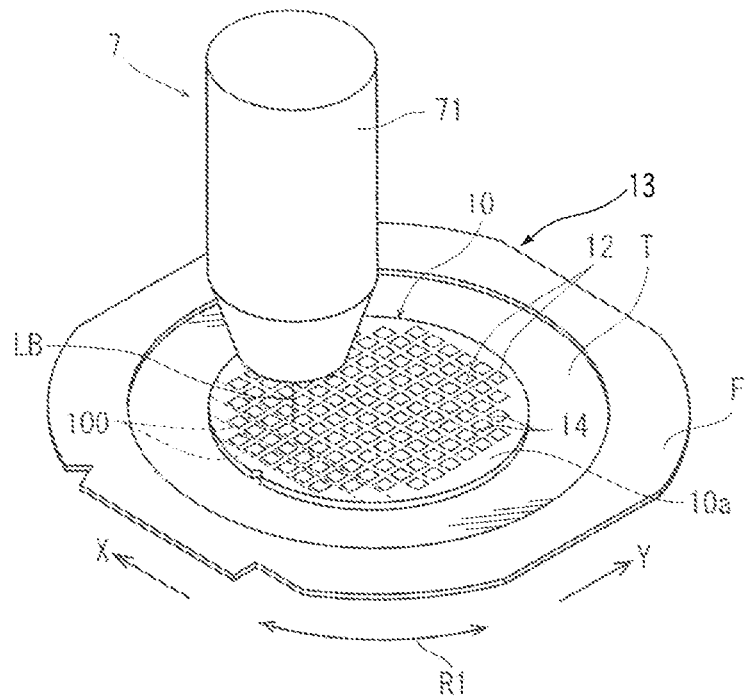
FIG. 3A is a perspective view illustrating a shield tunnel forming step.
Figure 3C:
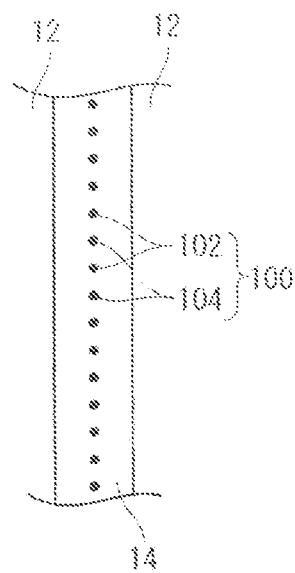
FIG. 3C is a plan view in which part of a wafer for which the shield tunnel forming step has been executed is illustrated in an enlarged manner.

Next, as illustrated in FIG. 3A, the wafer 10 is positioned directly under a light collector 71 of the laser beam irradiation unit 7. Then, while the X-axis movement mechanism 4a is actuated to execute processing feed of the wafer 10 in the X-axis direction on the basis of the position information stored in the controller, a region in which the planned dividing line 14 is formed is irradiated with a laser beam LB. As is understood from FIG. 3C in which part of the planned dividing line 14 is illustrated in an enlarged manner, a dividing layer 100 including shield tunnels 102 and 104 is formed inside the wafer 10 along a central region of the planned dividing line 14.

Figure 3B:
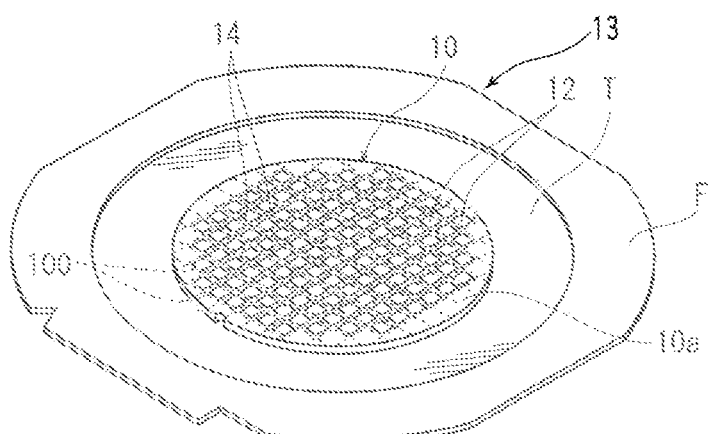
FIG. 3B is a perspective view of the wafer unit obtained after completion of the shield tunnel forming step.
Figure 3D:
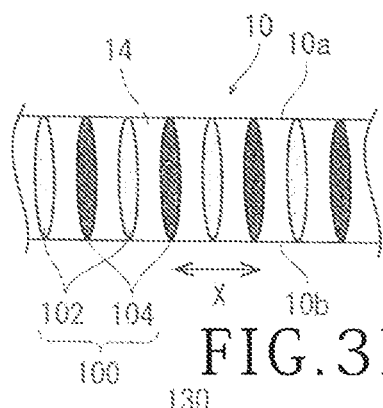
FIG. 3D is a sectional view in which part of the wafer obtained after completion of first and second shield tunnel forming steps is illustrated in an enlarged manner.
Figure 3E:
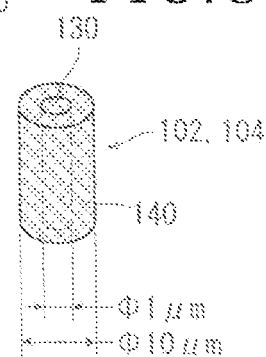
FIG. 3E is a schematic perspective view of a shield tunnel.

In the irradiation with the above-described laser beam LB, a numerical aperture (NA) of a light collecting lens included in the light collector 71 of the laser beam irradiation unit 7 of the present embodiment is set in such a manner that a value obtained by dividing the NA by a refractive index (N) of the wafer 10 falls within a range from 0.05 to 0.2, for example. Further, a wavelength of the laser beam LB is set to, for example, 532 nm, which is a wavelength having transmissibility with respect to the wafer 10. An average output power is set to 0.2 to 0.4 W, and a repetition frequency is set to 10 kHz. Energy per pulse is set to 2.0 to $4.0 \cdot 10^{-3}$ J, and an interval of a spot is set to 10 to 15 μm. By positioning a focal point of the laser beam LB to a position inside the wafer 10 and executing irradiation with the laser beam LB on the basis of such laser processing conditions, as illustrated in FIG. 3D, the shield tunnels 102 and 104 are formed, and the dividing layer 100 that becomes a division initiating point when applied with an external force to be described later is formed. As is understood from a perspective view illustrated in FIG. 3E in an enlarged manner, the shield tunnels 102 and 104 each have a fine pore 130 and a modified tube 140 that surrounds the fine pore 130. For example, a diameter of the fine pore 130 is approximately 1 μm, and a diameter of the modified tube 140 is approximately 10 μm.

In the above-described shield tunnel forming step, for example, a first shield tunnel forming step of successively forming the shield tunnels 102 first along the central region of the planned dividing line 14 with interposition of at least intervals (for example, 10 to 15 μm) corresponding to one shield tunnel is executed. Subsequently, a second shield tunnel forming step of successively forming the shield tunnels 104 for the regions in which the intervals are provided in the central region of the planned dividing line 14 is executed. That is, the shield tunnels 102 and the shield tunnels 104 are alternately formed along the X-axis direction to form the dividing layer 100. By executing the first shield tunnel forming step and the second shield tunnel forming step in the formation of the dividing layer 100 in this manner, development of a crack to a region outside the planned dividing line 14 can be suppressed. Moreover, an influence of a hot spot that would be generated when irradiation with the laser beam LB is executed to successively form shield tunnels adjacent to each other is avoided, and the problem that a crack develops to a region in which a device 12 is formed and the device 12 is damaged can be avoided.

The purpose of executing the first shield tunnel forming step and the second shield tunnel forming step with interposition of an interval in terms of time in the above-described embodiment is to avoid the influence of a hot spot as described above. This is because, when the first shield tunnel forming step is executed with the interval of the shield tunnels 102 shortened, diffusion of heat generated when the shield tunnels 102 are formed is not sufficient, and it is impossible to avoid development of a crack to a region in which a device 12 is formed. Preferably, the laser processing conditions are the same between the first shield tunnel forming step and the second shield tunnel forming step. However, different laser processing conditions may be employed.

After the dividing layer 100 including the shield tunnels 102 and 104 is formed along the predetermined planned dividing line 14 as described above, indexing feed of the wafer 10 is executed in the Y-axis direction, and an unprocessed planned dividing line 14 that is adjacent to the predetermined planned dividing line 14 in the Y-axis direction and extends in a first direction is positioned directly under the light collector 71. Then, as is the case described above, the focal point of the laser beam LB is positioned inside the wafer 10 along the central region of the unprocessed planned dividing line 14, and irradiation is executed to sequentially execute the above-described first shield tunnel forming step and second shield tunnel forming step. The shield tunnels 102 and 104 are thus formed to form another dividing layer 100. Similarly, processing feed and indexing feed of the wafer 10 are executed in the X-axis direction and the Y-axis direction, and the dividing layers 100 similar to the above-described one are formed along all the planned dividing lines 14 extending in the first direction. Subsequently, the wafer 10 is rotated by 90 degrees in a direction indicated by an arrow R1 in FIG. 3A, and planned dividing lines 14 extending in a second direction orthogonal to the planned dividing lines 14 along which the dividing layers 100 have already been formed are aligned with the X-axis direction. Then, as is the case described above, the focal point of the laser beam LB is positioned inside the wafer 10 along each of the central regions of the planned dividing lines 14 extending in the second direction, and irradiation is executed. Accordingly, as illustrated in FIG. 3B, the dividing layers 100 are formed along all the planned dividing lines 14 formed on the front surface 10a of the wafer 10, so that the shield tunnel forming step of the present embodiment is completed.

Figure 4:
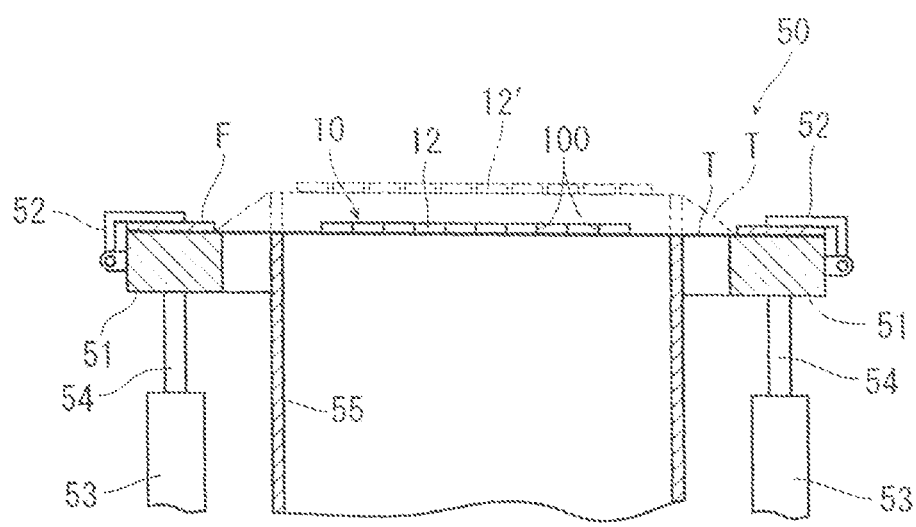
FIG. 4 is a sectional view illustrating a manner in which a dividing step is executed by a dividing apparatus giving an external force to the wafer.

After the above-described shield tunnel forming step is executed, a dividing step of applying an external force to the wafer 10 to divide the wafer 10 into individual device chips 12' is executed with use of a dividing apparatus 50 illustrated in FIG. 4, for example.

The illustrated dividing apparatus 50 includes a frame holding component 51 that holds the annular frame F holding the wafer 10, a plurality of clamps 52 as fixing means disposed at an outer circumference of the frame holding component 51, and an expanding drum 55 disposed inside the frame holding component 51. An outer diameter of the expanding drum 55 is set smaller than an inner diameter of the annular frame F, and an inner diameter of the expanding drum 55 is set larger than an outer diameter of the wafer 10. Further, a plurality of air cylinders 53 that cause the frame holding component 51 to advance and retreat in an upward-downward direction are disposed outside the expanding drum 55, and piston rods 54 caused to advance and retreat in the upward-downward direction by the air cylinders 53 are coupled to a lower surface of the frame holding component 51. The plurality of air cylinders 53 and the piston rods 54 thus constitute support means, which is configured to allow the annular frame holding component 51 to selectively move between a reference position at which the frame holding component 51 is at substantially the same height as an upper end of the expanding drum 55 as illustrated by solid lines in FIG. 4 and an expanding position at which the frame holding component 51 is separated downward from the upper end of the expanding drum 55 by a predetermined amount as illustrated by two-dot chain lines in FIG. 4.

Operation of the above-described dividing apparatus 50 will be described. The annular frame F that supports the wafer 10 in which the dividing layers 100 have been formed along the planned dividing lines 14 is placed on a placement surface of the frame holding component 51 and is fixed to the frame holding component 51 by the clamps 52. At this time, the piston rods 54 of the air cylinders 53 are in an extended state, and the frame holding component 51 is positioned at the reference position as illustrated by the solid lines in FIG. 4.

The frame holding component 51 positioned at the reference position as illustrated by the solid lines in the diagram is lowered through actuation of the plurality of air cylinders 53 that configure external force applying means, and the annular frame F also lowers. As a result, the adhesive tape T attached to the annular frame F abuts against the upper end edge of the expanding drum 55 that relatively rises, and is expanded as illustrated by the two-dot chain lines in the diagram. Consequently, a tensile external force radially acts on the wafer 10 attached to the adhesive tape T, and the wafer 10 is divided into the individual device chips 12' in such a manner that the planned dividing lines 14 having been made fragile by the dividing layers 100 become division initiating points. Through the above, the dividing step is completed.

The present invention is not limited to the above-described embodiment. In the formation of the shield tunnels in the above-described shield tunnel forming step, the shield tunnels may be formed to be stacked by shifting the position of the focal point in the upward-downward direction when irradiation with the laser beam LB is executed in a thickness direction of the wafer 10. For example, in the shield tunnel forming step executed for a wafer 10 with a thickness of 500 µm, the following processing may be executed as is understood from a sectional view of the wafer 10 illustrated in FIG. 5. The first shield tunnel forming step of successively forming shield tunnels 111 in the planned dividing line 14 aligned with the X-axis direction in the wafer 10 with interposition of at least intervals corresponding to one shield tunnel is executed, and the second shield tunnel forming step of successively forming shield tunnels 112 in the regions in which the intervals are provided in the planned dividing line 14 is executed. Subsequently, a third shield tunnel forming step of forming shield tunnels 113 above the formed shield tunnels 111 is executed, and a fourth shield tunnel forming step of forming shield tunnels 114 above the shield tunnels 112 formed in the second shield tunnel forming step is executed.

Figure 5:
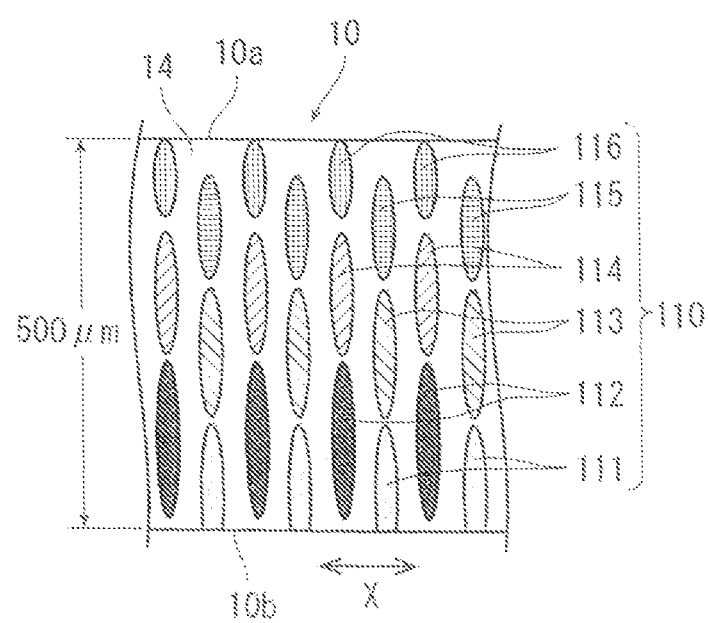
FIG. 5 is a sectional view in which part of the wafer in another embodiment of the shield tunnel forming step is enlarged.

In the embodiment illustrated in FIG. 5, fifth and sixth shield tunnel forming steps of forming shield tunnels 115 and 116 in such a manner as to further stack the shield tunnels 115 and 116 above the shield tunnels 113 and 114 are executed in addition to the above-described first to fourth shield tunnel forming steps, to thereby form a dividing layer 110. Further, the focal points used when irradiation with the laser beam LB is executed to form the shield tunnels 111 to 116 are positioned in such a manner as to be shifted from each other in the upward-downward direction, and the shield tunnels 111 formed in the first shield tunnel forming step and the shield tunnels 112 formed in the second shield tunnel forming step are formed in such a manner that steps are alternately made in the thickness direction of the wafer 10.

Accordingly, when the shield tunnel forming step is executed for a thick workpiece, the influence attributable to a hot spot is avoided more effectively, and development of a crack to a region in which a device 12 is formed is prevented by the dividing layers 110. In the present embodiment, steps are alternately made in the thickness direction also when the shield tunnels 113 to 116 are formed in the third to sixth shield tunnel forming steps, and a similar effect is provided. In the above-described first to sixth shield tunnel forming steps, when the shield tunnels are stacked in the thickness direction, the shield tunnels on the upper side are stacked in such a manner as not to be in contact with the shield tunnels on the lower side. This can suppress occurrence of a crack compared with the case in which the shield tunnels on the upper side are formed to be in contact with the shield tunnels on the lower side.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method by which a wafer in which a plurality of devices are formed on a front surface in such a manner as to be marked out by a plurality of planned dividing lines that intersect is divided into individual device chips, the wafer processing method comprising:
    a shield tunnel forming step of executing irradiation with a laser beam with a wavelength having transmissibility with respect to the wafer to form shield tunnels each including a fine pore and a modified tube that surrounds the fine pore; and
    a dividing step of applying an external force to the wafer to divide the wafer into the individual device chips after executing the shield tunnel forming step, wherein the shield tunnel forming step includes a first shield tunnel forming step of successively forming the shield tunnels in one planned dividing line with interposition of at least intervals corresponding to one shield tunnel, and a second shield tunnel forming step of successively forming the shield tunnels in regions in which the intervals are provided in the planned dividing line,
    wherein approximately half of the length of the shield tunnels formed in the second shield tunnel forming step overlaps the shield tunnels formed in the first shield tunnel forming step in a thickness direction of the wafer.

2. The wafer processing method according to claim 1, wherein
    the shield tunnels formed in the first shield tunnel forming step and the shield tunnels formed in the second shield tunnel forming step are formed in such a manner that steps are alternately made in a thickness direction.

3. The wafer processing method according to claim 1, wherein
    the shield tunnels are stacked in a thickness direction of the wafer in the shield tunnel forming step.

4. The wafer processing method according to claim 3, wherein
    the shield tunnel forming step includes, when the shield tunnels are stacked,
        a third shield tunnel forming step of forming shield tunnels above the shield tunnels formed in the first shield tunnel forming step, and
        a fourth shield tunnel forming step of forming shield tunnels above the shield tunnels formed in the second shield tunnel forming step.

5. The wafer processing method according to claim 3, wherein,
    in the shield tunnel forming step, when the shield tunnels are stacked in the thickness direction of the wafer, the shield tunnels on an upper side are stacked in such a manner as not to be in contact with the shield tunnels on a lower side.

6. The wafer processing method according to claim 1, wherein
the wavelength of the laser beam is 532 nm, power per pulse is 2.0 to 4.0·$10^{-5}$ J, and an interval of a spot is 10 to 15 μm.

7. A wafer processing method by which a wafer in which a plurality of devices are formed on a front surface in such a manner as to be marked out by a plurality of planned dividing lines that intersect is divided into individual device chips, the wafer processing method comprising:
   a shield tunnel forming step of executing irradiation with a laser beam with a wavelength having transmissibility with respect to the wafer to form a plurality of shield tunnels each including a fine pore and a modified tube that surrounds the fine pore; and
   a dividing step of applying an external force to the wafer to divide the wafer into the individual device chips after executing the shield tunnel forming step, wherein
the shield tunnel forming step includes
   a first shield tunnel forming step of successively forming a plurality of first shield tunnels in one planned dividing line with interposition of at least intervals corresponding to one shield tunnel, and
   a second shield tunnel forming step of successively forming a plurality of second shield tunnels in regions in which the intervals are provided in the planned dividing line,
wherein the first shield tunnels and the second shield tunnels have a same predetermined length in the thickness direction of the wafer, and the first shield tunnels and the second shield tunnels overlap along the entire predetermined length.

8. The wafer processing method according to claim 6, wherein the wavelength of the laser beam is 532 nm, power per pulse is 2.0 to 4.0·$10^{-5}$ J, and an interval of a spot is 10 to 15 μm.

\* \* \* \* \*